(12) United States Patent
Yonezawa

(10) Patent No.: US 10,595,405 B2
(45) Date of Patent: Mar. 17, 2020

(54) TERMINAL CONNECTION STRUCTURE AND DISPLAY APPARATUS

(71) Applicant: Sakai Display Products Corporation, Osaka (JP)

(72) Inventor: Nobuhiro Yonezawa, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 15/997,585

(22) Filed: Jun. 4, 2018

(65) Prior Publication Data

US 2018/0288872 A1 Oct. 4, 2018

Related U.S. Application Data

(63) Continuation-in-part of application No. PCT/JP2015/084298, filed on Dec. 7, 2015.

(51) Int. Cl.
*G02F 1/1345* (2006.01)
*H05K 3/32* (2006.01)
(Continued)

(52) U.S. Cl.
CPC .............. *H05K 1/11* (2013.01); *G02F 1/1343* (2013.01); *G02F 1/13306* (2013.01); *G02F 1/13458* (2013.01); *H05K 1/118* (2013.01); *H05K 3/361* (2013.01); *G02F 1/133514* (2013.01); *G09G 3/36* (2013.01); *G09G 3/3607* (2013.01); *H05K 3/323* (2013.01); *H05K 2201/097* (2013.01);
(Continued)

(58) Field of Classification Search
CPC ......... G02F 1/1345; G02F 1/133–1345; G02F 1/13458; G09G 3/2096; H01L 2224/13; H05K 2201/09–09654
See application file for complete search history.

(56) References Cited

U.S. PATENT DOCUMENTS

2010/0321624 A1* 12/2010 Yanagisawa .......... G02F 1/1345
349/152

FOREIGN PATENT DOCUMENTS

JP         H1027957 A     1/1998
JP         2009218264 A * 9/2009 ............. H01L 24/05
(Continued)

OTHER PUBLICATIONS

Iketa, the English translation of JP-2009218264-A, 2009.*
(Continued)

*Primary Examiner* — Michael H Caley
*Assistant Examiner* — Jonathan Y Jung
(74) *Attorney, Agent, or Firm* — Snell & Wilmer L.L.P.

(57) ABSTRACT

The terminal connection structure includes a first terminal group 80 including a plurality of first terminals 81 aligned side-by-side, and a second terminal group 110 including a plurality of second terminals 112 aligned side-by-side and connected to the plurality of first terminals 81, the second terminal group 110 opposing to the first terminal group 80 and electrically connected to the first terminal group 80 via an anisotropic conductive film, wherein each of the first terminals 81 has a recess-projection shape and each of the second terminals 112 has a recess-projection shape, two adjacent first terminals 81A, 81B have different and corresponding shapes with each other, and two adjacent second terminals 112A, 112B have different and corresponding shapes with each other.

13 Claims, 7 Drawing Sheets

(51) Int. Cl.
  H05K 1/11 (2006.01)
  H05K 3/36 (2006.01)
  G02F 1/133 (2006.01)
  G02F 1/1343 (2006.01)
  G09G 3/36 (2006.01)
  G02F 1/1335 (2006.01)
(52) U.S. Cl.
  CPC .............. *H05K 2201/09381* (2013.01); *H05K 2201/09445* (2013.01)

(56) References Cited

FOREIGN PATENT DOCUMENTS

| | | | |
|---|---|---|---|
| JP | 2009218264 A | 9/2009 | |
| JP | 2011238951 A | 11/2011 | |
| JP | 2013239652 A | 11/2013 | |

OTHER PUBLICATIONS

English Translation of International Search Report, PCT International Application No. PCT/JP2015/084298, Japan Patent Office, dated Mar. 1, 2016.

\* cited by examiner

TERMINAL CONNECTION STRUCTURE AND DISPLAY APPARATUS

CROSS-REFERENCE TO RELATED APPLICATION

This is a continuation-in-part of PCT international application No. PCT/JP2015/084298 filed on Dec. 7, 2015, incorporated herein by reference.

BACKGROUND OF THE INVENTION

The present invention relates to a terminal connection structure of a first terminal group including a plurality of first terminals aligned side-by-side and a second terminal group including a plurality of second terminals connected to the plurality of first terminals, the second terminal group opposing to the first terminal group.

BACKGROUND ART

In recent years, in a display apparatus using a liquid crystal display panel, an increase of resolution, that is, an increase of the number of pixels per unit area has progressed to display a sharper image. Such an increase of the number of pixels is likely to cause narrow pitch of the connection terminals and thus a leak defect due to a connection position discrepancy may occur.

On the contrary, in JP 2013-239652 A, there is disclosed a semiconductor apparatus in which in a predetermined displacement prevention region of a peripheral region of a semiconductor chip, at least one second lead wire is laid out, or alternatively, a second projection electrode is laid out so as to be sandwiched between lead wires to form a displacement prevention pattern. In this manner, the semiconductor apparatus disclosed above is capable of reducing a bonding displacement between a first lead wire and the first projection electrode exerted by variation of the thickness of the semiconductor chip or the height of the projection electrode and then making it easy to achieve fine pitch of the projection electrodes while avoiding a leak defect.

SUMMARY OF THE INVENTION

The problem of narrow pitch as described above has been dealt by reducing the particle size of an anisotropic conductive film (ACF) other than such a method of JP 2013-239652 A.

On the other hand, recently, so called 4K or 8K display apparatuses of high resolution have been diffused. In such display apparatuses, there is a need to further reduce the pitches of the connection terminals. Therefore, a leak defect due to a position discrepancy of connection is more likely to occur. However, such a sort of solution has already reached its technical limit, and the problem described above cannot be solved.

The present invention has been made in view of the circumstance described above, and an object of the present invention is to provide a terminal connection structure of a first terminal group including a plurality of first terminals aligned side-by-side and a second terminal group including a plurality of terminals connected to the plurality of first terminals, the second terminal group opposing to the first terminal group, the structure being capable of more reliably carrying out connection and of restraining an occurrence of a leak defect due to a connection position discrepancy; and a display apparatus provided with the terminal connection structure.

A terminal connection structure according to one embodiment of comprises a first terminal group including a plurality of first terminals aligned side-by-side, and a second terminal group including a plurality of second terminals aligned side-by-side and connected to the plurality of first terminals, the second terminal group opposing to the first terminal group and electrically connected to the first terminal group via an anisotropic conductive film, wherein each of the first terminals has a recess-projection shape and each of the second terminals has a recess-projection shape, two adjacent first terminals have different and corresponding shapes with each other, and two adjacent second terminals have different and corresponding shapes with each other.

A display apparatus according to one embodiment of the present invention a display panel displaying an image; and a driving part driving the display panel by inputting a signal via the first terminal and the second terminal connected to each other by the terminal connection structure mentioned above.

A terminal connection structure capable of more reliably carrying out connection and of restraining an occurrence of a leak defect due to a connection position discrepancy; and a display device provided with the terminal connection structure are provided.

DETAILED DESCRIPTION

Hereinafter, a terminal connection structure and a display apparatus according to embodiments of the present invention will be described in detail with reference to the drawings, by way of example of a case in which the terminal connection structure and display apparatus are applied to a television image receiver. A light source part of the television image receiver may be of a so called direct light type or may be of an edge-light type. For the sake of clarity, the following description will be furnished by way of example of a case in which the light source part of the television image receiver is of the direct light type.

(Embodiment 1)

Figure 1:
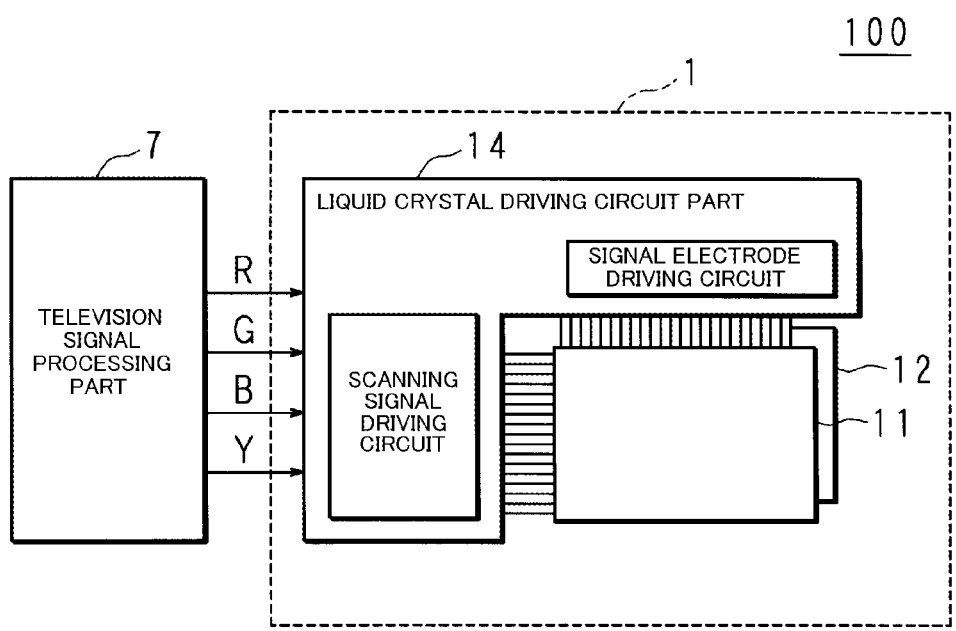
FIG. 1 is a functional block diagram depicting an example of a configuration of a television image receiver according to Embodiment 1.

FIG. 1 is a functional block diagram depicting an example of a configuration of a television image receiver according to Embodiment 1.

A television image receiver 100 according to the embodiment is a substantially rectangular, flat hexahedron. The television image receiver 100 has a liquid crystal panel module 1 displaying an image on a front surface and a television signal processing part 7 converting a color image signal received by a tuner (not shown) to a signal of red (R), green (G), and blue (B) associated with a color image.

The liquid crystal panel module 1 has a liquid crystal panel 11 having color filters of red (R), green (G), and blue (B), a backlight 12 emitting light toward a rear surface of the liquid crystal panel 11, and a liquid crystal driving circuit part 14 (driving part) driving the liquid crystal panel 11 in accordance with the red, green, and blue television signals converted by the television signal processing part 7 to display a color image. The liquid crystal driving circuit part 14 has a signal electrode driving circuit and a scanning signal driving circuit or the like.

The liquid crystal panel 11 has two substantially rectangular glass substrates opposing with each other via a spacer, and a liquid crystal layer which is sealed between the two glass substrates. Specifically, the liquid crystal panel 11 has a color filter substrate provided on the front side of the liquid crystal panel 11, a TFT substrate provided on the rear side of the liquid crystal panel 11, and a liquid crystal layer which is sealed between the color filter substrate and the TFT substrate. On a rear surface, which faces the TFT substrate, of the color filter substrate, color filters and a counter electrode (not shown) are arranged. On a front surface, which faces the color filter substrate, of the TFT substrate, a scanning line and a signal line are arranged in a matrix. At a crossing part between the scanning line and the signal line, a TFT (Thin Film Transistor) and a pixel electrode for applying a voltage to a liquid crystal corresponding to each pixel are provided. A gate electrode of each TFT is connected to the scanning line, and a source electrode is connected to the signal line.

Figure 2:
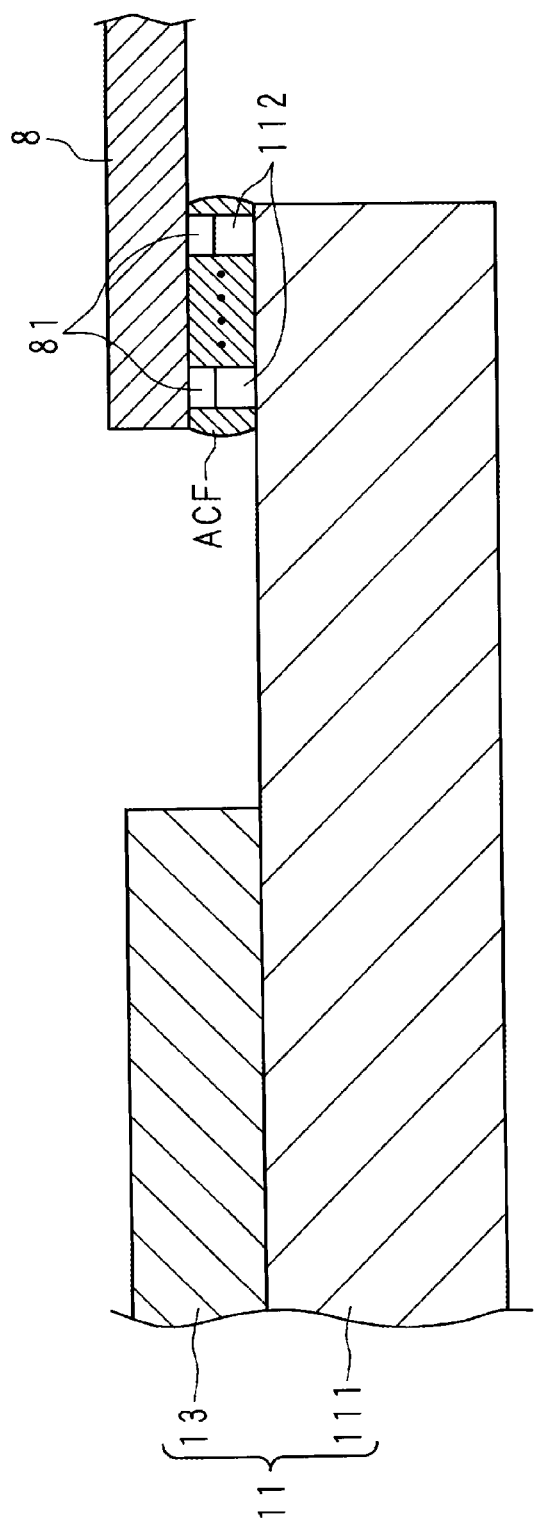
FIG. 2 is a partial sectional view illustrating electrical connection in a liquid crystal panel of the television image receiver according to Embodiment 1.

FIG. 2 is a partial sectional view illustrating electrical connection in the liquid crystal panel 11 of the television image receiver 100 according to Embodiment 1.

As shown in FIG. 2, in a peripheral region of the front surface, which faces the color filter 13, of the TFT substrate 111, a plurality of substrate terminals 112 (first terminals) receiving a signal for driving the liquid crystal panel 11 are aligned side-by-side to form a substrate terminal group (first terminal group). The liquid crystal panel 11 is driven based on a signal received from a COF (Chip on Film) 8 mounting a signal electrode driving circuit or a scanning signal driving circuit via substrate terminals 112, . . . , 112.

The COF 8 transmits a signal associated with driving of the liquid crystal panel 11 to the liquid crystal panel 11 via the substrate terminals 112, . . . , 112 of the TFT substrate 111. In the COF 8, a plurality of connection terminals 81 (second terminals) for connection to the substrate terminals 112, . . . , 112 of the TFT substrate 111 are aligned side-by-side. The plurality of connection terminals 81, . . . , 81 form a connection terminal group (the second terminal group) so as to oppose to the substrate terminal group of the substrate terminals 112.

The substrate terminal group including the substrate terminals 112, . . . , 112 and the connection terminal group including the connection terminals 81, . . . , 81 constitute a terminal connection structure according to the embodiment. In FIG. 2, a part of the substrate terminals 112 included in the substrate terminal group and a part of the connection terminals 81 included in the connection terminal group are not shown.

Each of the substrate terminals 112 is connected to each of connection terminals 81 targeted to be connected, and the COF 8 and the circuit on the TFT substrate 111 are electrically connected to each other. At this juncture, between the substrate terminals 112 (substrate terminal group) and the connection terminals 81 (connection terminal group), an anisotropic conductive film (ACF) is interposed, and the substrate terminals 112 and the connection terminals 81 are electrically connected to each other via the conductive particles of the ACF.

Figure 3:
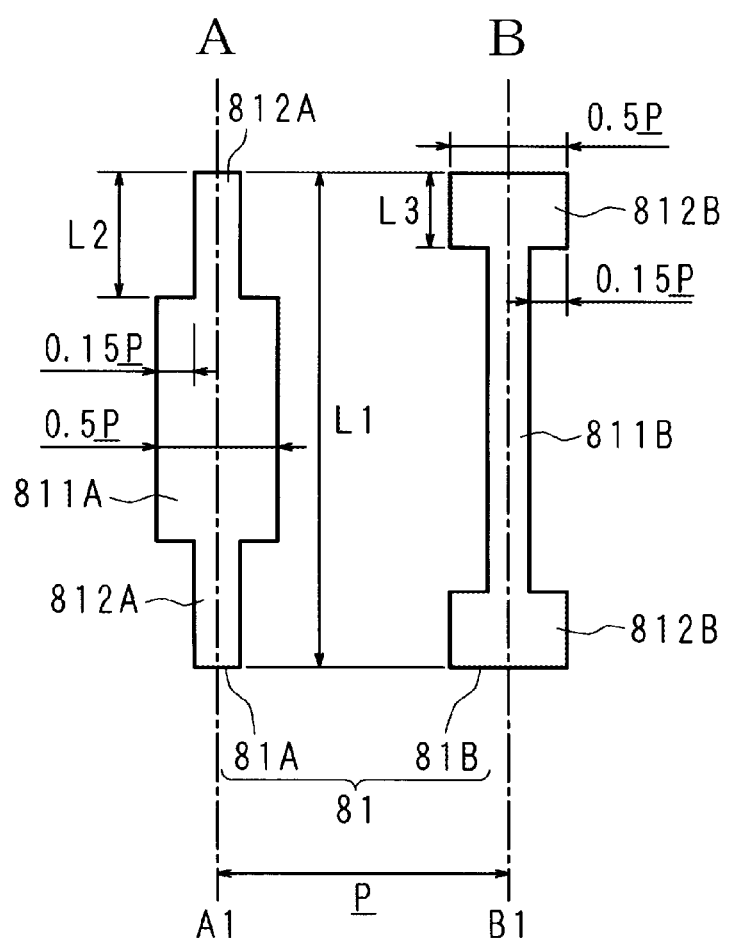
FIG. 3 is an exemplary view showing an example of a shape of a connection terminal in the television image receiver according to Embodiment 1.
Figure 4:
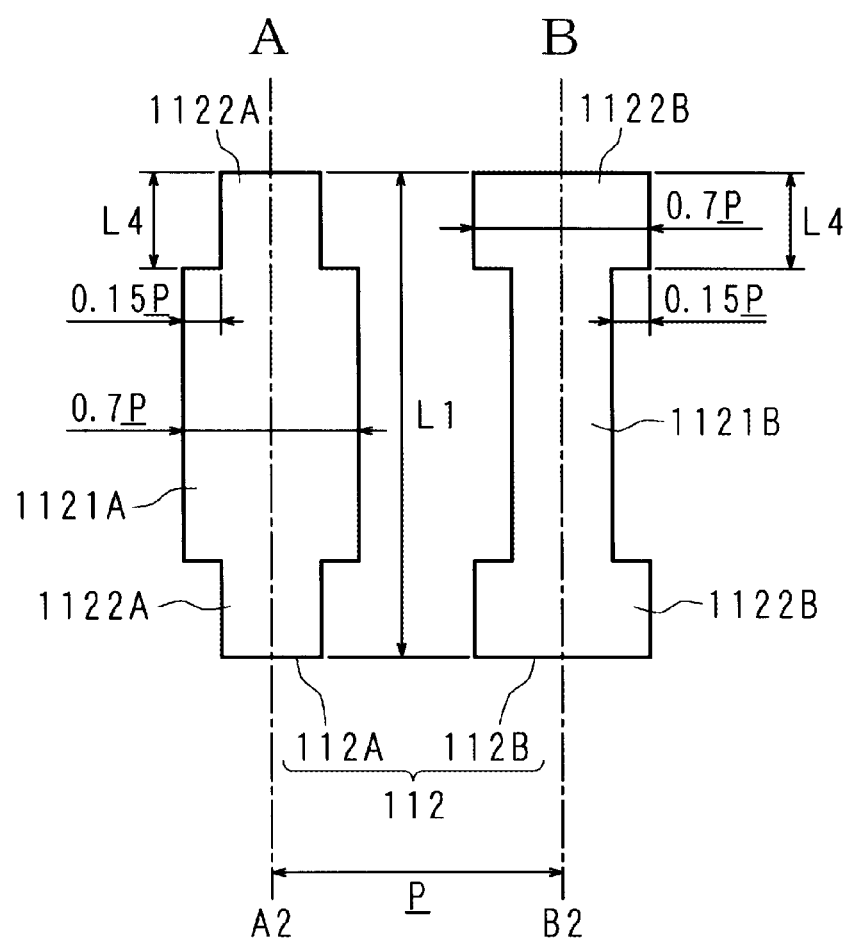
FIG. 4 is an exemplary view showing an example of a shape of a substrate terminal in the television image receiver according to Embodiment 1.

FIG. 3 is an exemplary view showing an example of the shape of the connection terminal 81 in the television image receiver 100 according to Embodiment 1, and FIG. 4 is an exemplary view showing an example of the shape of the substrate terminal 112 in the television image receiver 100 according to Embodiment 1.

As shown in FIG. 3, each of the connection terminals 81 has a recess-projection shape. Two adjacent connection terminals 81 have different and corresponding shapes with each other in a direction in which a plurality of connection terminals 81 are aligned side-by-side (hereinafter, referred to as an alignment direction of the connection terminal group). The "different and corresponding shapes" refer to shapes in which in a case where a projection part is provided to one connection terminal of two adjacent connection terminals, a recess part is provided to the other connection terminal of the two adjacent connection terminals in a location opposite to the projection part of the one connection terminal so that the projection part of the one connection terminal can be accommodated in the recess part of the other connection terminal and the area of the recess part of the other connection terminal is equal to or larger than that of the projection part. In other words, the "different and corresponding shapes" refer to shapes in which in a case where a recess part is provided to one connection terminal of two adjacent connection terminals, a projection part is provided to the other connection terminal of the two adjacent connection terminals in a location opposite to the recess part of the one connection terminal so that the projection part of the other connection terminal can be accommodated in the recess part of the one connection terminal and the area of the projection part is equal to or smaller than that of the recess part. In the connection terminal group, a connection terminal 81A and a connection terminal 81B each having recess-projection shape and facing with each other are alternately aligned side-by-side.

In the embodiment, the connection terminal 81A and the connection terminal 81B each have an elongated shape in which the dimension in a vertical direction vertical to the alignment direction of the connection terminal group is larger than the dimension in the alignment direction. The connection terminal 81A has a rectangular intermediate part 811A which is an intermediate region of the connection terminal 81A in the vertical direction, and rectangular end parts 812A, 812A extended from an intermediate part 811A to both ends in the vertical direction. Each of the end parts 812A, 812A is smaller in width than the intermediate part 811A in the alignment direction. In the embodiment, the intermediate part 811A is larger than the end part 812A in dimensions in the alignment direction and the vertical direction. The end part 812A is extended in the vertical direction from a center of an edge (shorter edge), which extends in the alignment direction, of the intermediate part 811A. Therefore, in the entire connection terminal 81A, the intermediate part 811A is a projection part projecting in the alignment direction with respect to the end parts 812A, 812A. In the entire connection terminal 81A, the end part 812A is a recess part recessing in the alignment direction with respect to the intermediate part 811A.

In the embodiment, the connection terminal 81B has a rectangular intermediate part 811B which is an intermediate region of the connection terminal 81B in the vertical direction, and rectangular end parts 812B, 812B extended from the intermediate part 811B to both ends in the vertical direction. Each of the end parts 812B, 812B is larger in width than the intermediate part 811B in the alignment direction. In the embodiment, the intermediate part 811B is larger than the end part 812B in dimensions in the vertical direction (longitudinal direction of the intermediate part 811B), and is smaller than the end part 812B in dimensions in the alignment direction (lateral direction of the intermediate part 811B). At the center in the alignment direction of each end part 812B, both ends of the intermediate part 811B are linked. The intermediate part 811B and the end part 812B are linked so that the longitudinal direction of the intermediate part 811B and the longitudinal direction of the end part 812B cross each other. In the entire connection terminal 81B, the end part 812B is a projection part projecting in the alignment direction with respect to the intermediate part 811B. In the entire connection terminal 81B, the intermediate part 811B is a recess part recessing in the alignment direction with respect to the end part 812B.

In the embodiment, in two adjacent connection terminals 81A, 81B, the projection part of one terminal (i.e., connection terminal 81A) is formed at the intermediate region of a side edge, which extends in the vertical direction of the connection terminal 81A. The recess part of the connection terminal 81A is formed at both end region, in the vertical direction, of the side edge of the connection terminal 81A, and the recess part of the connection terminal 81A is recessed in the alignment direction with respect to the projection part of the connection terminal 81A.

The recess part of remaining terminal (i.e., connection terminal 81B) is formed at an intermediate region of a side edge, which extends in the vertical direction, of the connection terminal 81B. The projection part of the connection terminal 81B is formed at both end region, in the vertical direction, of the side edge of the connection terminal 81B. The recess part of the connection terminal 81B is recessed in the alignment direction with respect to the projection part of the connection terminal 81B.

The projection part of the connection terminal 81A is projected toward the recess part of the connection terminal 81B and the projection part of the connection terminal 81B is projected toward the recess part of the connection terminal 81A.

In the embodiment, presupposing that the pitches between the two adjacent connection terminals 81A, 81B in the alignment direction are P (a distance between lines A1 and B1 in FIG. 3), the dimension in the alignment direction (lateral direction) of the intermediate part 811A and the dimension in the vertical direction (longitudinal direction) of the end part 812B are both 0.5 P. In the alignment direction of the connection terminal group, a step difference of 0.15 P exists between the intermediate part 811A and the end part 812A, and a step difference of 0.15 P also exists between the intermediate part 811B and the end part 812B. It should be noted that these dimensions are merely exemplary, and dimensions which are different therefrom may be set.

On the other hand, as shown in FIG. 4, each of the substrate terminals 112 has a recess-projection shape. Two adjacent substrate terminals 112 have different and corresponding shapes with each other in a direction in which a plurality of substrate terminals 112 are aligned side-by-side (hereinafter, referred to as an alignment direction (second alignment direction) of the substrate terminal group). In the substrate terminal group, a substrate terminal 112A and a substrate terminal 112E each having recess-projection shape and facing with each other are alternately aligned side-by-side.

In the embodiment, the substrate terminal 112A and the substrate terminal 112B each have an elongated shape in which the dimension in a vertical direction vertical to the alignment direction of the substrate terminal group is larger than the dimension in the alignment direction. The substrate terminal 112A has a rectangular intermediate part 1121A which is an intermediate region of the substrate terminal 112A in the vertical direction, and rectangular end parts 1122A, 1122A extended from the intermediate part 112 to both sides in the vertical direction. Each of the end parts 1122A, 1122A is smaller in width than the intermediate part 1121A in the alignment direction. As in the connection terminal 81A, in the entire substrate terminal 112A, the intermediate part 1121A is a projection part projecting in the alignment direction with respect to the end parts 1122A, 1122A. In the entire substrate terminal 112A, the end part 1122A is a recess part recessing in the alignment direction with respect to the intermediate part 1121A.

In the embodiment, the substrate terminal 112B has a rectangular intermediate part 1121B which is an intermediate region of the substrate terminal 112B in the vertical direction, and rectangular end parts 1122B, 1122B extended from the intermediate part 1121B to both ends in the vertical direction. Each of the end parts 1122B, 1122B is larger in width than the intermediate part 1121B in the alignment direction. As in the connection part 81B, in the entire substrate terminal 112B, the end part 1122B is a projection part projecting in the alignment direction with respect to the intermediate part 1121B. In the entire substrate terminal 112B, the intermediate part 1121B is a recess part recessing in the alignment direction with respect to the end part 1122B.

In the embodiment, in two adjacent substrate terminals 112A, 112B, the projection part of one terminal (i.e., substrate terminal 112A) is formed at the intermediate region of a side edge, which extends in the vertical direction of the substrate terminal 112A. The recess part of the substrate terminal 112A is formed at both end region, in the vertical direction, of the side edge of the substrate terminal 112A, and the recess part of the substrate terminal 112A is recessed in the alignment direction with respect to the projection part of the substrate terminal 112A.

The recess part of remaining terminal (i.e., substrate terminal 112B) is formed at an intermediate region of a side edge, which extends in the vertical direction, of the substrate terminal 112B.

The projection part of the substrate terminal 112B is formed at both end region, in the vertical direction, of the side edge of the substrate terminal 112B. The recess part of the substrate terminal 112B is recessed in the alignment direction with respect to the projection part of the substrate terminal 112B.

The projection part of the substrate terminal 112A is projected toward the recess part of the substrate terminal 112B and the projection part of the substrate terminal 112B is projected toward the recess part of the substrate terminal 112A.

In the embodiment, presupposing that the pitches between the two adjacent substrate terminals 112A, 112B in the alignment direction are P (the distance between lines A2 and B2 in FIG. 4), the dimension in the alignment direction (lateral direction) of the intermediate part 1121A and the dimension in the vertical direction (longitudinal direction) of the end part 1122B are both 0.7 P. In the alignment direction of the substrate terminal group, a step difference of 0.15 P exists between the intermediate part 1121A and the end part 1122A, and a step difference of 0.15 P also exists between the intermediate part 1121B and the end part 1122B. The dimension of the end part 1122A (represented as L4 in FIG. 4) in the vertical direction (along the longitudinal direction of the intermediate part 1121A) and the dimension of the end part 1122B (represented as L4 in FIG. 4) in the vertical direction (along the longitudinal direction of the intermediate part 1121B) are equal to each other. It should be noted that these dimensions are merely exemplary, and dimensions which are different therefrom may be determined.

In the embodiment, the dimensions of the respective end parts 812A, 812B, 1122A, 1122B of the connection terminal 81 and the substrate terminal 112 have the following relationship:

$$L2=L4+0.1\ P$$

$$L3=L4-0.1\ P$$

As understood from FIG. 3 and FIG. 4, in the embodiment, the substrate terminal 112A is larger than the connection terminal 81A to be connected thereto in at least the alignment direction, and the substrate terminal 112B is larger than the connection terminal 81B to be connected thereto in at least the alignment direction. It should be noted that the substrate terminal 112A and the connection terminal 81A may have a substantially same shape or may have a similar shape. Similarly, the substrate terminal 112B and the connection terminal 81B may have a substantially same shape or may have a similar shape. The connection terminal 81A may be larger than the substrate terminal 112A or the connection terminal 81B may be larger than the substrate terminal 112B in at least the alignment direction.

In addition, as understood from FIG. 3 and FIG. 4, in the embodiment, the connection terminals 81A and the connection terminals 81B each have a linearly symmetrical shape in the alignment direction of the respective terminal group, and the substrate terminals 112A and the substrate terminals 112B each have a linearly symmetrical shape in the alignment direction of the respective substrate terminal group.

That is, the connection terminal 81A is linearly symmetrical with respect to a reference line A1 extending orthogonal to the alignment direction of the connection terminal group, the reference line A1 passing through the middle of the connection terminals 81A in the alignment direction of the connection terminal group. The connection terminal 81B is linearly symmetrical with respect to a reference line B1 extending orthogonal to the alignment direction of the connection terminal group, the reference line B1 passing through a middle of the connection terminal 81B in the alignment direction of the connection terminal group.

Such a linearly symmetrical shape is the same in the substrate terminal 112A and the substrate terminal 112B as well. That is, the substrate terminal 112A is linearly symmetrical with respect to a reference line A2 extending orthogonal to the alignment direction of the substrate terminal group, the reference line A2 passing through the middle of the substrate terminal 112A in the alignment direction of the substrate terminal group. The substrate terminal 112B is linearly symmetrical with respect to a reference line B2 extending orthogonal to the alignment direction of the substrate terminal group, the reference line B2 passing through a middle of the substrate terminal 112B in the alignment direction of the substrate terminal group.

Figure 5:
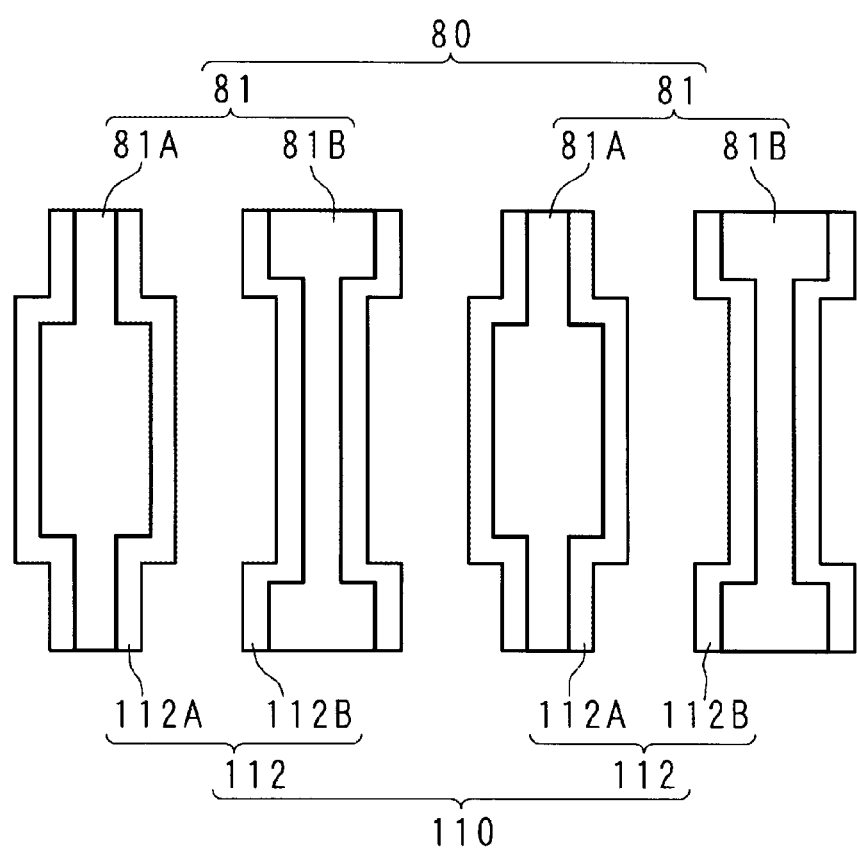
FIG. 5 is an illustrative view illustrating a case in which no position discrepancy occurs in connection between the connection terminal and the substrate terminal in the television image receiver according to Embodiment 1.
Figure 6:
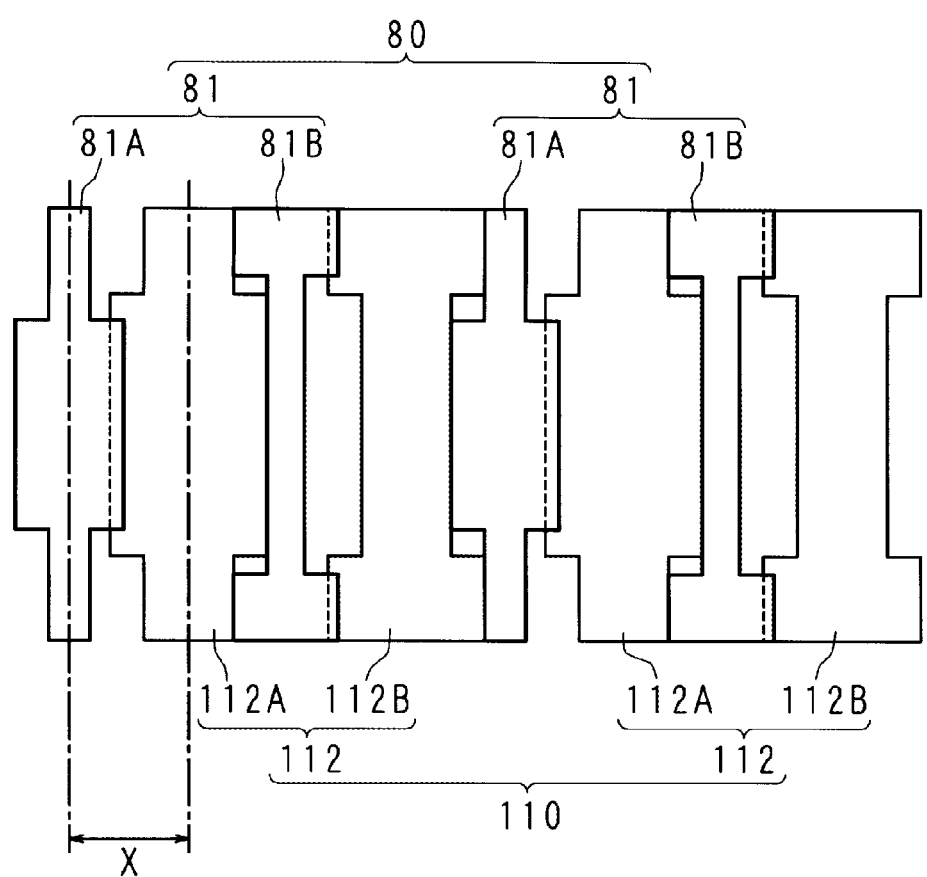
FIG. 6 is an illustrative view illustrating a case in which a position discrepancy occurs in connection between the connection terminal and the substrate terminal in the television image receiver according to Embodiment 1.

FIG. 5 is an illustrative view illustrating a case in which no position discrepancy occurs in connection between the connection terminal 81 and the substrate terminal 112 in the television image receiver 100 according to Embodiment 1, and FIG. 6 is an illustrative view illustrating a case in which a position discrepancy occurs in connection between the connection terminal 81 and the substrate terminal 112 in the television image receiver 100 according to Embodiment 1.

FIG. 5 and FIG. 6 each show a connection terminal group 80 provided to the COF 8 and including connection terminals 81, . . . , 81 aligned side-by-side and a substrate terminal group 110 provided to TFT substrate 111 including substrate terminals 112, . . . , 112 aligned side-by-side. It should be noted that for the sake of clarity, FIG. 5 and FIG. 6 each show a case in which the substrate terminal group 110 has four substrate terminals 112, and the connection terminal group 80 has four connection terminals 81. However, the number of substrate terminals 112 constituting the substrate terminal group 110 and the number of connection terminals 81 constituting the connection terminal group 80 each are not limited to four.

As shown in FIG. 5, in a case where no position discrepancy occurs in connection between the connection terminal 81 and the substrate terminal 112, the connection terminal 81 and the substrate terminal 112 overlap each other in the thickness direction of the TFT substrate 111, and the connection terminal 81 is positioned in the range of the substrate terminal 112. In this case, the connection terminal 81 and the substrate terminal 112 are normally connected to each other.

For example, as shown in FIG. 6, at the time of connection to the connection terminal 81 or the substrate terminal 112, a position discrepancy may be likely to occur in the alignment direction of the connection terminal group 80 or in the alignment direction of the substrate terminal group 110 (hereinafter, simply referred to as a terminal alignment direction). In the television image receiver 100 according to the embodiment, two adjacent connection terminals 81 of the connection terminal group 8 have different and corresponding shapes with each other and two adjacent substrate terminals 112 of the substrate terminal group 110 have different and corresponding shapes with each other. Therefore, an allowable quantity of position discrepancy X without connection (leak) between terminals which should not be connected with each other (for example, substrate terminal 112A and connection terminal 81B) can be increased as much as possible while connection between terminals targeted to be connected (for example, connection terminal 81A and substrate terminal 112A) has been maintained. Hereinafter, allowable quantity of position discrepancy without connection (leak) between terminals which should not be connected with each other is referred to simply as the allowable quantity of position discrepancy.

In the case of the conventional terminal connection structure in which the connection terminals and the substrate terminals are rectangular in shape, the structure is as follows. That is, if the conventional connection terminals have the same area and length in the longitudinal direction (the vertical direction vertical to the alignment direction) as the connection terminals 81 according to the embodiment, the length of the conventional connection terminal in the alignment direction is shorter than that of the connection terminals 81 in the projection part. Similarly, if the conventional substrate terminals have the same area and length in the longitudinal direction as the substrate terminals 112 according to the embodiment, the length in the alignment direction of the substrate terminal group is shorter than that of the substrate terminals 112 in the projection part. Therefore, in the conventional terminal connection structure, if a position discrepancy occurs by the allowable quantity of position discrepancy X in the embodiment, connection between the terminals targeted to be connected cannot be maintained. It should be noted that the areas of the connection terminals and the substrate terminals each are required to be a predetermined value or more. In addition, the length in the longitudinal direction of the connection terminals and the substrate terminals (the length in the vertical direction vertical to terminal alignment direction) is required to be a predetermined value or less in view of a layout space.

In addition, in the embodiment, in the terminal alignment direction, the dimension of the substrate terminal 112 is larger than the dimension of the connection terminal 81. Therefore, the connection terminal 81 and the substrate terminal 112 are reliably connected in comparison with a case in which the dimension of connection terminal 81 in the alignment direction is equal to that of the substrate terminal 112 in the alignment direction.

Although the foregoing description has been furnished by way of a case in which a position discrepancy occurs in the terminal alignment direction at the time of connection to the connection terminal 81 or the substrate terminal 112, it is possible to attain the same advantageous effects that even in a case where a position discrepancy occurs in the direction crossing the terminal alignment direction, the allowable quantity of position discrepancy can be increased as much as possible while connection between the terminals targeted to be connected has been maintained.

(Embodiment 2)

In Embodiment 2, the configuration of the television image receiver 100, the configuration of the liquid crystal panel 11, and the basic configuration of the connection terminals 81 and the substrate terminals 112 are the same as those of Embodiment 1. Hereinafter, descriptive matters which are different from Embodiment 1 will be set forth.

Figure 7:
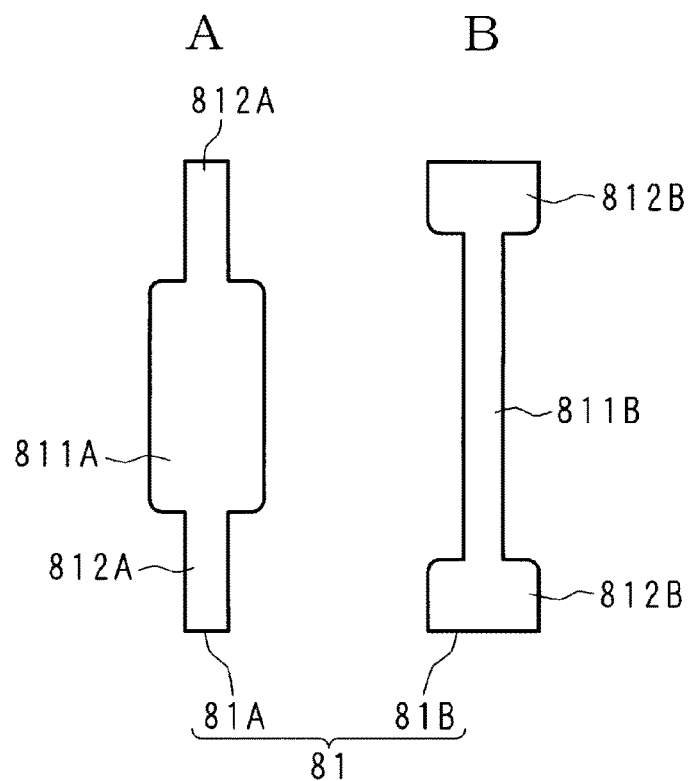
FIG. 7 is an exemplary view showing an example of a shape of a connection terminal in a television image receiver according to Embodiment 2.
Figure 8:
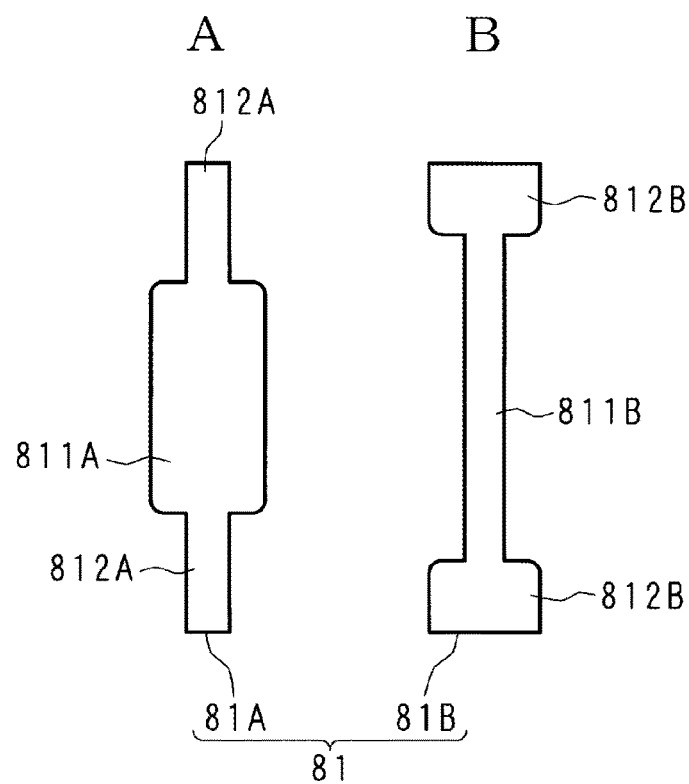
FIG. 8 is an exemplary view showing an example of the shape of the connection terminal in the television image receiver according to Embodiment 2.

FIG. 7 is an exemplary view showing an example of the shape of a connection terminal 81 in a television image receiver 100 according to Embodiment 2, and FIG. 8 is an exemplary view showing an example of the shape of a substrate terminal 112 in the television image receiver 100 according to Embodiment 2.

As shown in FIG. 7, in Embodiment 2, a corner of a projection part curves at each of an intermediate part 811A that is a projection part of a connection terminal 81A and an end part 812B that is a projection part of a connection terminal 81B.

In addition, as shown in FIG. 8, in Embodiment 2, a corner of a projection part curves at each of an intermediate part 1121A that is a projection part of a substrate terminal 112A and an end part 1122B that is a projection part of a substrate terminal 112B.

In the embodiment, the corners of the projection parts curve at the connection terminal 81 and the substrate terminal 112. Therefore, the generation of connection (leak) between the terminals which should not be connected can be reliably prevented.

Although the embodiments of the present invention have been described hereinabove, the present invention is not limited to these embodiments, and various modifications can be applied without departing from the spirit of the invention.

For example, in the connection terminal 81 and the substrate terminal 112, the corners of the recess parts may curve in place of, or in addition to, the fact that the corners of the projection parts curve.

Also, for example, although the embodiments have been described by way of example of a case in which a terminal connection structure and a display apparatus are applied to a television image receiver, the terminal connection structure and display apparatus may be applied to another apparatus such as a digital signage or a smartphone, for example.

For example, although in the embodiments, a display apparatus having a terminal connection structure has been a liquid crystal panel 11, the above display apparatus is not limited thereto and may be another display apparatus such as an organic EL (Electro Luminescence) display.

REFERENCE SIGN LISTS

8 COF
11 Liquid crystal panel
80 Connection terminal group
81 Connection terminal
100 Television image receiver
110 Substrate terminal group
111 TFT substrate
112 Substrate terminal

What is claimed is:

1. A terminal connection structure comprising:
    a first terminal group including a plurality of first terminals aligned side-by-side; and
    a second terminal group including a plurality of second terminals aligned side-by-side and connected to the plurality of first terminals, the second terminal group opposing to the first terminal group and electrically connected to the first terminal group via an anisotropic conductive film, wherein
    each of the first terminals has a recess-projection shape as viewed from the second terminal group and each of the second terminals has a recess-projection shape as viewed from the first terminal group,
    two adjacent first terminals have different and corresponding shapes with each other, and
    two adjacent second terminals have different and corresponding shapes with each other.

2. The terminal connection structure according to claim 1, wherein the first terminals and the second terminals to be connected to each other have a similar or substantially same shape.

3. The terminal connection structure according to claim 1, wherein each of the first terminals is linearly symmetrical with respect to a first reference line extending orthogonal to a first alignment direction in which the first terminals are aligned side-by-side, the first reference line passing through a middle of each of the first terminals in the first alignment direction of the first terminals, and
    each of the second terminals is linearly symmetrical with respect to a second reference line extending orthogonal to a second alignment direction in which the second terminals are aligned side-by-side, the second reference line passing through a middle of each of the second terminals in the second alignment direction of the second terminals.

4. The terminal connection structure according to claim 1, wherein each of the first terminals has a projection part and a recess part, the projection part of one first terminal of two adjacent first terminals aligned side-by-side is formed at an intermediate region of a side edge, which extends in a first vertical direction vertical to a first alignment direction in which the first terminals are aligned side-by-side, of the one first terminal, the recess part of the one first terminal is formed at both end region, in the first vertical direction, of the side edge of the one first terminal, and the recess part of the one first terminal is recessed in the first alignment direction with respect to the projection part of the one first terminal, the recess part of a remaining first terminal of the two adjacent first terminals is formed at an intermediate region of a side edge, which extends in the first vertical direction, of the remaining first terminal, the projection part of the remaining first terminal is formed at both end region, in the first vertical direction, of the side edge of the remaining first terminal, and the recess part of the remaining first terminal is recessed in the first alignment direction with respect to the projection part of the remaining first terminal, and the projection part of the one first terminal is projected toward the recess part of the remaining first terminal and the projection part of the remaining first terminal is projected toward the recess part of the one first terminal.

5. The terminal connection structure according to claim 4, wherein each of the second terminals has a projection part and a recess part, the projection part of one second terminal of two adjacent second terminals aligned side-by-side is formed at an intermediate region of a side edge, which extends in a second vertical direction vertical to a second alignment direction in which the second terminals are aligned side-by-side, of the one second terminal, the recess part of the one second terminal is formed at both end region, in the second vertical direction, of the side edge of the one second terminal, and the recess part of the one second terminal is recessed in the second alignment direction with respect to the projection part of the one second terminal, the recess part of a remaining second terminal of the two adjacent second terminals is formed at an intermediate region of a side edge, which extends in the second vertical direction, of the remaining second terminal, the projection part of the remaining second terminal is formed at both end region, in the second vertical direction, of the side edge of the remaining second terminal, and the recess part of the remaining second terminal is recessed in the second alignment direction with respect to the projection part of the remaining second terminal, and the projection part of the one second terminal is projected toward the recess part of the remaining second terminal and the projection part of the remaining second terminal is projected toward the recess part of the one second terminal.

6. The terminal connection structure according to claim 1, wherein each of the first and second terminals has a projection part and a recess part, and the first terminal and the second terminal each curve at a corner of the projection part and/or the recess part.

7. The terminal connection structure according to claim 1, wherein either one of the first terminal and the second terminal to be connected to each other is larger in an alignment direction in which the first terminals are aligned side-by-side than another one of the first terminal and the second terminal.

8. A display apparatus comprising:
a display panel displaying an image; and
a driving part driving the display panel by inputting a signal via the first terminal and the second terminal connected to each other by the terminal connection structure according to claim 1.

9. The terminal connection structure according to claim 1, wherein
each of the first terminals comprises at least one first region in which a projection part is formed at a side edge, which is an end of each of the first terminals in a first alignment direction in which the first terminals are aligned side-by-side, and at least one second region in which a recess part is formed at the side edge of each of the first terminals;

each of the second terminals comprises at least one third region in which a projection part is formed at a side edge, which is an end of each of the second terminals in a second alignment direction in which the second terminals are aligned side-by-side, and at least one fourth region in which a recess part is formed at the side edge of each of the second terminals;

the projection part of one first terminal of the two adjacent first terminals projects toward the recess part of the other first terminal of the two adjacent first terminals;

the projection part of one second terminal of the two adjacent second terminals projects toward the recess part of the other second terminal of the two adjacent second terminals;

the length of the first region in the first alignment direction is greater than or equal to the length of the third region in the second alignment direction; and the length of the second region in the first alignment direction is greater than or equal to the length of the fourth region in the second alignment direction.

10. The terminal connection structure according to claim 9, wherein
the length of the first region in the direction orthogonal to the first alignment direction is greater than or equal to the length of the third region in the direction orthogonal to the second alignment direction.

11. The terminal connection structure according to claim 9, wherein
the amount of projection of the projection part of the first terminals and the amount of projection of the projection part of the second terminals are substantially identical.

12. The terminal connection structure according to claim 9, wherein
the distance between the first region of the one first terminal and the second region of the other first terminal is shorter than the length of the third region in the second alignment direction and longer than the length of the fourth region in the second alignment direction.

13. The terminal connection structure according to claim 9, wherein
each of the first terminals comprises a plurality of at least one of the first region and the second region;
each of the second terminals comprises a plurality of at least one of the third region and the fourth region;
the first region and the second region are alternately provided in the direction orthogonal to the first alignment direction; and the third region and the fourth region are alternately provided in the direction orthogonal to the second alignment direction.

\* \* \* \* \*